(12) United States Patent
Chen et al.

(10) Patent No.: US 8,642,477 B2
(45) Date of Patent: Feb. 4, 2014

(54) METHOD FOR CLEARING NATIVE OXIDE

(75) Inventors: Yen-Chu Chen, Nantou County (TW);
Teng-Chun Tsai, Hsinchu (TW);
Chien-Chung Huang, Taichung Hsien (TW); Keng-Jen Liu, Kaohsiung County (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 1336 days.

(21) Appl. No.: 12/129,978

(22) Filed: May 30, 2008

(65) Prior Publication Data

US 2009/0298294 A1     Dec. 3, 2009

(51) Int. Cl.
*H01L 21/302* (2006.01)
*C23F 1/00* (2006.01)

(52) U.S. Cl.
USPC ........... 438/706; 438/689; 438/710; 438/723; 216/58; 216/67; 134/1.1; 134/102.1

(58) Field of Classification Search
USPC .............. 438/689, 706, 710, 723; 216/58, 67; 134/1.1, 102, 102.1
See application file for complete search history.

(56) References Cited

U.S. PATENT DOCUMENTS

| | | | |
|---|---|---|---|
| 5,030,319 A * | 7/1991 | Nishino et al. | 216/87 |
| 6,184,132 B1 | 2/2001 | Cantell | |
| 6,352,919 B1 | 3/2002 | Tu | |
| 6,372,657 B1 * | 4/2002 | Hineman et al. | 438/723 |
| 6,720,225 B1 | 4/2004 | Woo | |
| 7,524,739 B2 | 4/2009 | Lin | |
| 2001/0039121 A1 * | 11/2001 | Gilton et al. | 438/694 |
| 2007/0015360 A1 | 1/2007 | Lu et al. | |
| 2007/0087573 A1 | 4/2007 | Chiang | |
| 2007/0269976 A1 | 11/2007 | Futase et al. | |
| 2008/0124937 A1 * | 5/2008 | Xu et al. | 438/724 |
| 2009/0191703 A1 * | 7/2009 | Lu et al. | 438/637 |
| 2010/0107927 A1 * | 5/2010 | Stewart et al. | 106/1.22 |

FOREIGN PATENT DOCUMENTS

TW         200628633         8/2006

* cited by examiner

*Primary Examiner* — Shamim Ahmed
(74) *Attorney, Agent, or Firm* — Winston Hsu; Scott Margo

(57) ABSTRACT

A method for clearing native oxide is described. A substrate is provided, including an exposed portion whereon a native oxide layer has been formed. A clearing process is performed to the substrate using nitrogen trifluoride ($NF_3$) and ammonia ($NH_3$) as a reactant gas, wherein the volumetric flow rate of $NF_3$ is greater than that of $NH_3$.

20 Claims, 5 Drawing Sheets

METHOD FOR CLEARING NATIVE OXIDE

BACKGROUND OF THE INVENTION

1. Field of the Invention

This invention relates to a semiconductor process, and in particular, to a method for clearing native oxide.

2. Description of Related Art

Along with rapid progress of semiconductor technology, the dimensions of semiconductor devices are reduced and the integrity thereof promoted continuously to further advance the operating speed and performance of the integrated circuit. As the demand for device integrity is raised, the changes in physical properties, such as contact resistance between the devices, have to be considered to avoid a great impact on the operating speed and performance of the circuit.

Taking the formation of a contact plug as an example, after a contact hole is formed but before the contact hole is filled with conductive material, a clearing process is generally conducted to clear the impurities or native oxide at the bottom of the contact hole so as to reduce the contact resistance. Nevertheless, there are still some problems in the foregoing method, so that the performance of the circuit is reduced.

FIGS. 1A-1B are schematic cross-sectional views illustrating a conventional fabrication process of a contact plug. As shown in FIG. 1A, a dielectric layer 102 has been formed on a silicon substrate 100, and a contact hole 104 has been formed in the dielectric layer 102 exposing a partial surface of the silicon substrate 100. As the exposed surface of the silicon substrate 100 contacts with the atmosphere, an oxidation takes place so that a native oxide layer 106 is formed at the bottom of the contact hole 104. A conventional method removes the native oxide layer 106 in a physical manner with argon (Ar) sputtering to solve the problems arising form the native oxide layer 106. However, the removal performance of the native oxide layer 106 by means of Ar sputtering is not satisfactory due to the high aspect ratio of the contact hole 104 formed in current fabrication processes.

As shown in FIG. 1B, a facet 110 is formed at the sidewall of the contact hole 104 during the Ar sputtering because of the arrival angle of Ar ion. While the contact hole 104 is filled with a conductive layer 108 in the later process to accomplish the contact plug, the conductive layer 108 formed between adjacent contact holes 104 tends to bring a bridging 112 due to the facet 110. Accordingly, the electrical properties of the devices are subjected to serious impact. Moreover, as the dimensions of the devices are miniaturized, by-products produced from the sputtering process are easily re-deposited in the contact hole 104, so that the profiles and critical dimensions of the contact hole 104 are changed.

As a result, how to effectively clear native oxide and also ensure the quality of the later-formed devices to improve the process reliability and device performance is one of the immediate issues to be solved in the art.

SUMMARY OF THE INVENTION

Accordingly, this invention is directed to a method for clearing native oxide so as to prevent the profiles and critical dimensions of openings from being changed and further reduce the contact resistance.

The method for clearing native oxide of this invention is described as follows. A substrate is provided, including an exposed portion on which a native oxide layer has been formed. A clearing process is performed to the substrate using nitrogen trifluoride ($NF_3$) and ammonia ($NH_3$) as a reactant gas, wherein the volumetric flow rate of $NF_3$ is greater than that of $NH_3$.

According to an embodiment of this invention, the volumetric flow rate ratio of $NF_3$ to $NH_3$ is within the range of 1.5:1 to 5:1, possibly being 2:1.

According to an embodiment of this invention, the reactant gas causes $NH_xHF_y$ to form in the clearing process, where x and y both are not zero.

According to an embodiment of this invention, the RF power applied in the clearing process is within the range of 5 W to 200 W, possibly being 60 W.

According to an embodiment of this invention, the duration of the clearing process is within the range of 5 seconds to 100 seconds.

According to an embodiment of this invention, the clearing process is performed at a temperature below 100° C.

According to an embodiment of this invention, the method further comprises performing a first annealing process after the clearing process. In such a case, the first annealing process may be performed at a temperature within the range of 360-440° C. The duration of the first annealing process is within the range of 40-80 seconds.

According to an embodiment of this invention, the method further comprises performing a second annealing process after the clearing process but before the first annealing process. In such a case, the second annealing process may be an in-situ annealing process, and may be performed at a temperature over 100° C.

According to an embodiment of this invention, the method further comprises adding a diluting gas into the reactant gas. The diluting gas may be an inert gas, and the volumetric flow rate ratio of the diluting gas to $NF_3$ to $NH_3$ is within the range of 10:1:1 to 5:1:5.

According to an embodiment of this invention, the exposed portion comprises a silicon-containing material or a metal. The silicon-containing material may be monocrystalline silicon, polysilicon or metal silicide.

According to an embodiment of this invention, the exposed portion is a region exposed in a contact hole, in a damascene opening, or in a trench of a shallow trench isolation (STI) structure to be formed.

As mentioned above, the method for clearing native oxide of this invention adjusts the mixing ratio of the reactant gas to have the volumetric flow rate of $NF_3$ greater than that of $NH_3$, so that the native oxide on the surface of the exposed portion is etched by the product formed from $NF_3$ and $NH_3$ making the etching reaction easily saturated. Consequently, the profiles and critical dimensions of the openings can be prevented from being changed, and also the device performance can be enhanced.

In order to make the aforementioned and other features and advantages of this invention more comprehensible, preferred embodiments accompanied with figures are described in detail below.

DESCRIPTION OF THE EMBODIMENTS

Figure 1A:
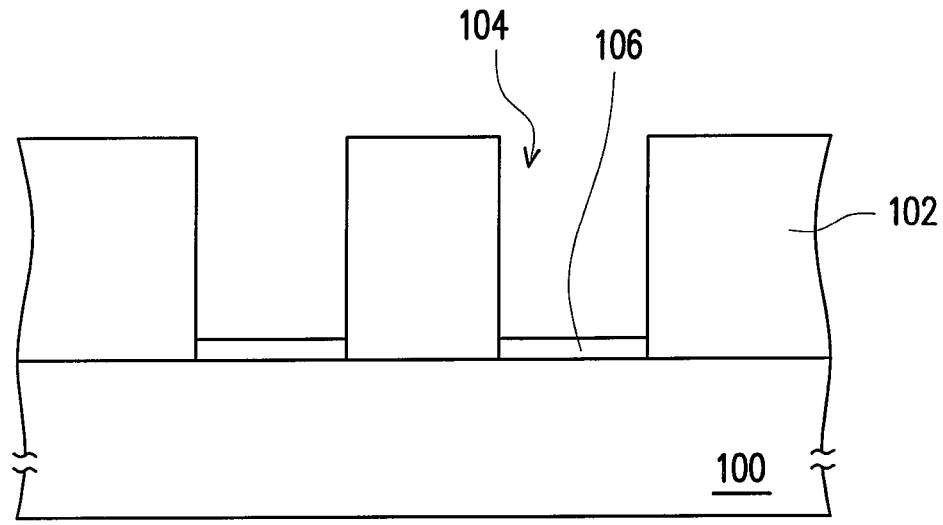
FIGS. 1A-1B are schematic cross-sectional views illustrating a conventional fabrication process of a contact plug.
Figure 1B:
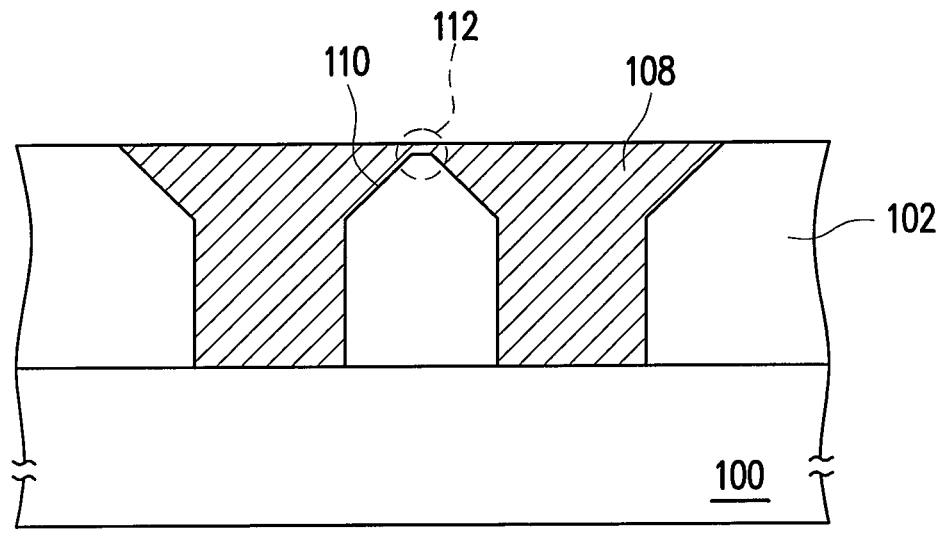

Reference will now be made in detail to the present preferred embodiments of the invention, examples of which are illustrated in the accompanying drawings. Wherever possible, the same reference numbers are used in the drawings and the description to refer to the same or like parts.

Figure 2:
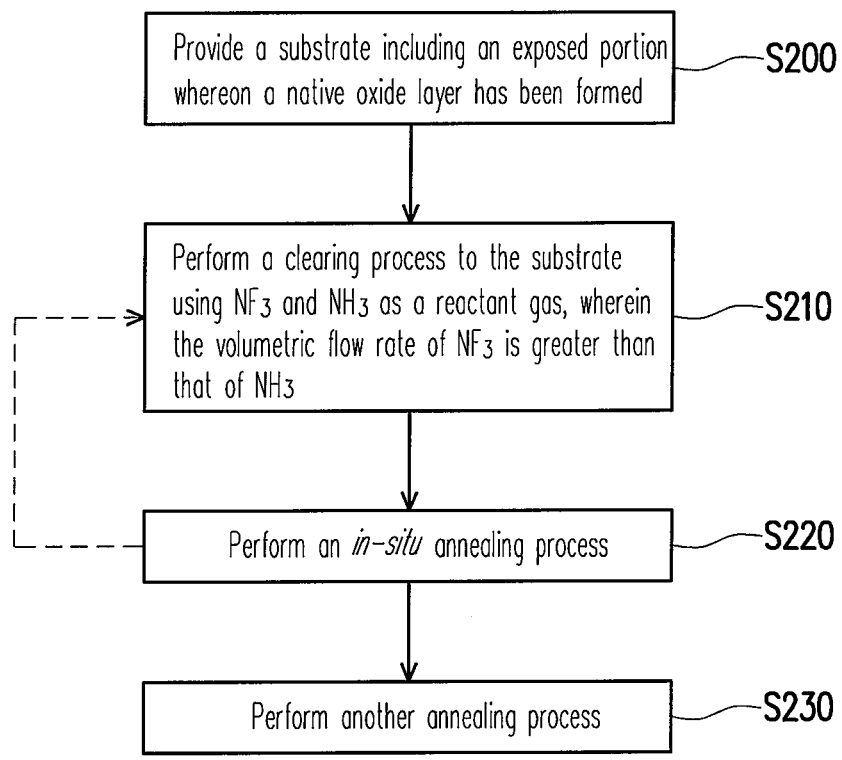
FIG. 2 is a flowchart illustrating a method for clearing native oxide according to an embodiment of this invention.

FIG. 2 is a flowchart illustrating a method for clearing native oxide according to an embodiment of this invention.

Referring to FIG. 2, in step S200, a substrate is provided, which has an exposed portion whereon a native oxide layer has been formed. The exposed portion can be a portion of a monocrystalline silicon substrate or a multi-film structure, wherein each film may include doped polysilicon, metal silicide or metal. The exposed portion is, for example, exposed in a contact hole, in a damascene opening or in a trench of a STI structure to be formed.

Afterwards, in step S210, a clearing process is performed to the substrate to remove the native oxide layer with nitrogen trifluoride ($NF_3$) and ammonia ($NH_3$) as a reactant gas, wherein the volumetric flow rate of $NF_3$ is greater than that of $NH_3$. In an embodiment, the volumetric flow rate ratio of $NF_3$ to $NH_3$ is within the range of 1.5:1 to 5:1. In another embodiment, the volumetric flow rate ratio of $NF_3$ to $NH_3$ is 2:1.

Moreover, an inert gas can be introduced into the reactant gas as a diluting gas or a carrier gas during the clearing process. In an embodiment, the introduced inert gas is argon (Ar) gas or helium (He) gas. The RF power applied in the clearing process is within the range of 5 W to 200 W. In an embodiment, the clearing process is performed at a temperature below 100° C. In another embodiment, the clearing process is performed at a temperature below 50° C. The pressure set in the clearing process is maintained at about 5 Torr. In addition, the duration of the clearing process is usually within the range of 5 seconds to 100 seconds, depending on the thickness of the native oxide layer.

$NF_3$ and $NH_3$ each can be dissociated into reactive species by RF power, as represented by the following reaction formulae:

$$NF_3 \rightarrow NF_x + F + N$$

$$NH_3 \rightarrow NH_x + H + N.$$

The fluorine dissociated from $NF_3$ and the hydrogen dissociated form $NH_3$ re-combine to form hydrogen fluoride (HF). HF can further combine with $NH_x$ dissociated from $NH_3$ or, in the alternative, with a small amount of $NH_3$ to form $NH_xHF_y$, where x and y both are not zero. Highly reactive $NH_xHF_y$ derived from $NF_3$ and $NH_3$ removes the native oxide layer by means of etching. In an embodiment, the native oxide layer includes silicon dioxide ($SiO_2$), which reacts with $NH_x$-$HF_y$ to form a solid product, ammonium hexafluorosilicate (($NH_4)_2SiF_6$), as represented by the following reaction formula:

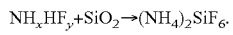
$$NH_xHF_y + SiO_2 \rightarrow (NH_4)_2SiF_6.$$

In next step S220, an in-situ annealing process is performed. In other words, the substrate is heated at the same place after the step S210. The in-situ annealing process is performed at a temperature over 100° C. and the duration thereof about 60 seconds, for example.

In an embodiment, the native oxide layer includes $SiO_2$, and the solid product $(NH_4)_2SiF_6$ generated in the step S210 is decomposed into volatile gas and removed by means of heating in the in-situ annealing process, as represented by the following reaction formula:

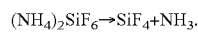
$$(NH_4)_2SiF_6 \rightarrow SiF_4 + NH_3.$$

It is noted that this invention adjusts the mixing ratio of the reactant gas so that the amount of $NF_3$ is greater than that of $NH_3$ and applies higher RF power to generate the plasma. Since a smaller amount of $NH_x$ is formed due to the reduced provision of $NH_3$ to decrease the amount of $NH_xHF_y$, generated form the reactant gas and the reaction of $NH_xHF_y$ with the oxide is diffusion-controlled, the reaction rate in removing the native oxide is lowered. After entire $NH_xHF_y$ derived from $NF_3$ and $NH_3$ reacts with the native oxide layer, a thin layer of the product is formed on the surface of the exposed portion, and thus the reaction is saturated preventing over-removal effectively.

In an embodiment, the cycle of the steps S210 to S220 can be repeated at least one time after the step S220 so as to clear the native oxide layer completely.

After the step S220, another annealing process may be performed optionally to re-crystallize the silicon substrate or metal silicide (step S230). Thereby, the defect density within the silicon substrate or metal silicide is decreased, and the material structures and electrical properties of the surface are repaired. The annealing process in the step S230 is performed at a temperature within the range of 360-440° C., and the duration thereof is within the range of 40-80 seconds. In an embodiment, the annealing process in the step S230 is performed at about 400° C. for about 60 seconds.

In the field of semiconductor process, several practical applications of the method for clearing native oxide according to this invention are provided below. It is to be understood that the following manufacturing procedures are intended to explain the sequence of the steps of the present method for clearing native oxide in practical applications and thereby enable those of ordinary skill in the art to practice this invention, but are not intended to limit the scope of this invention. It is to be appreciated by those of ordinary skill in the art that other elements, such as the substrate, the gate structure, the doping regions, the conductive lines and the openings, can be arranged and formed in a manner not shown in the illustrated embodiments according to known knowledges in the art.

Figure 3A:
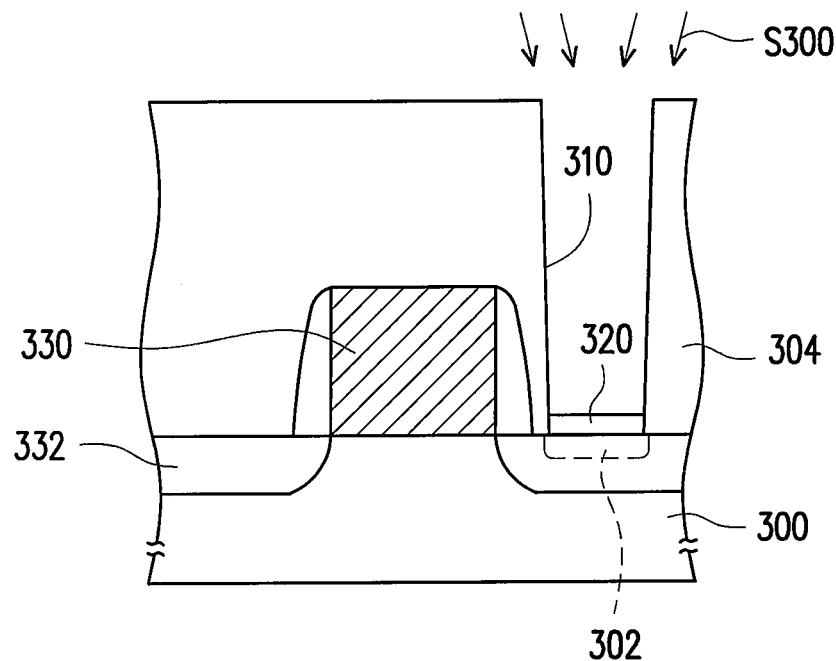
FIGS. 3A-3B are schematic cross-sectional views illustrating a fabrication process of a contact plug according to an embodiment of this invention.
Figure 3B:
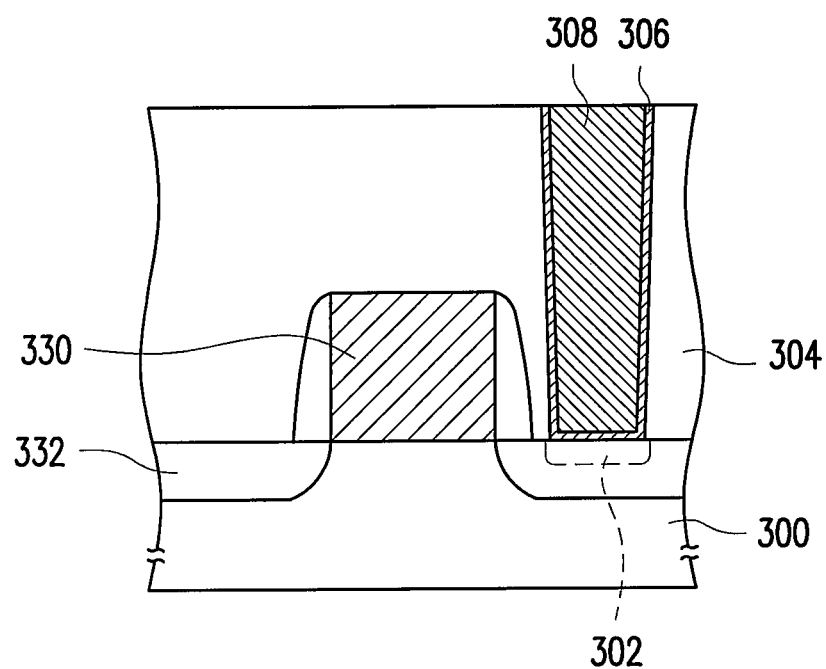

FIGS. 3A-3B are schematic cross-sectional views illustrating the fabrication process of a contact plug according to an embodiment of this invention.

Referring to FIG. 3A, a substrate 300 is provided, which may be a semiconductor substrate, e.g., a silicon substrate. A dielectric layer 304 is formed on the substrate 300, and an opening 310 which exposes a region 302 of the substrate 300 is formed in the dielectric layer 304. The exposed portion 302 is, for example, a conductive portion containing silicon. The silicon-containing conductive portion is, for example, a gate electrode or a doped region. The material of the gate can be doped polysilicon. The doped region is, for example, a source region or a drain region, and the material thereof can be N-type or P-type doped monocrystalline silicon or polysilicon. In an embodiment, the silicon-containing conductive region may be a gate or a doped region whereon a metal silicide layer has been formed. The material of the metal silicide layer can be silicide of a refractory metal, and the refractory metal is, for example, nickel (Ni), cobalt (Co), titanium (Ti), copper (Cu), molybdenum (Mo), tantalum (Ta), tungsten (W), erbium (Er), zirconium (Zr), platinum (Pt), or one of the alloys of the foregoing metals. The material of the dielectric layer 304 can be silicon dioxide, borophosphosilicate glass (BPSG), phosphosilicate glass (PSG) or any other suitable dielectric material. In this embodiment, a MOS transistor including a gate structure 330 and source and drain regions 332 is taken as an example, and the exposed portion 302 exposed in the opening 310 in the dielectric layer 304 is the source and drain regions 332. In another embodiment, the opening 310 is formed over the gate structure 330. That is, the exposed portion 302 is the gate conductor of the gate structure 330.

After the opening 310 is formed, wafers might be briefly exposed to the atmosphere while being transferred to the next processing equipment for conducting the subsequent process. As shown in FIG. 3A, since the formation of the opening 310 makes the surface of the exposed portion 302 contact with oxygen in the atmosphere, oxidation takes place on the surface of the exposed portion 302 at the bottom of the opening 310 and in consequence a native oxide layer 320 is formed.

Referring to FIG. 3B, a clearing step S300 that uses the method for clearing native oxide of this invention is done to remove the native oxide layer 320, possibly in accordance with the procedure shown in FIG. 2. In an embodiment, the gas introduced in the clearing process includes Ar, $NF_3$ and $NH_3$, and the ratio of the volumetric flow rates of the three gases is within the range of 10:1:1 to 5:1:5. The RF power applied in the clearing process is within the range of 5 W to 200 W, such as 60 W. In an embodiment, the clearing process is performed at a temperature below 100° C. In another embodiment, the clearing process is performed at a temperature below 50° C. In addition, the pressure set in the clearing process is maintained at about 5 Torr. The duration of the clearing process depends on the thickness of the native oxide layer 320 and is usually within the range of 5 seconds to 100 seconds, such as 40 seconds.

Afterwards, an adhesion layer 306 is formed conformally on the surface of the opening 310 to enhance adhesion between the dielectric layer 304 and the conductive material which fills the opening 310 in the subsequent process. The material of the adhesion layer 306 is, for example, a refractory metal or a nitride or an alloy thereof, such as titanium, titanium nitride, tungsten, tungsten nitride, titanium-tungsten alloy, tantalum, tantalum nitride, nickel or nickel-vanadium alloy. A conductive layer 308 is then filled in the opening 310 to complete the fabrication of the contact plug. The material of the conductive layer 308 is, for example, doped polysilicon, aluminium, tungsten or copper.

It is noted that the opening 310 and the adhesion layer 306 may be formed in different process equipments or be formed not right after the formation of the opening 310. Therefore, not only after the formation of the opening 310 but also before the formation of the adhesion layer 306, a process for clearing native oxide including the steps S210 to S220 in FIG. 2 can be performed. As a result, the native oxide layer 320 can be removed completely, and the contact resistance of the contact plug can be reduced to promote the device performance.

Figure 4A:
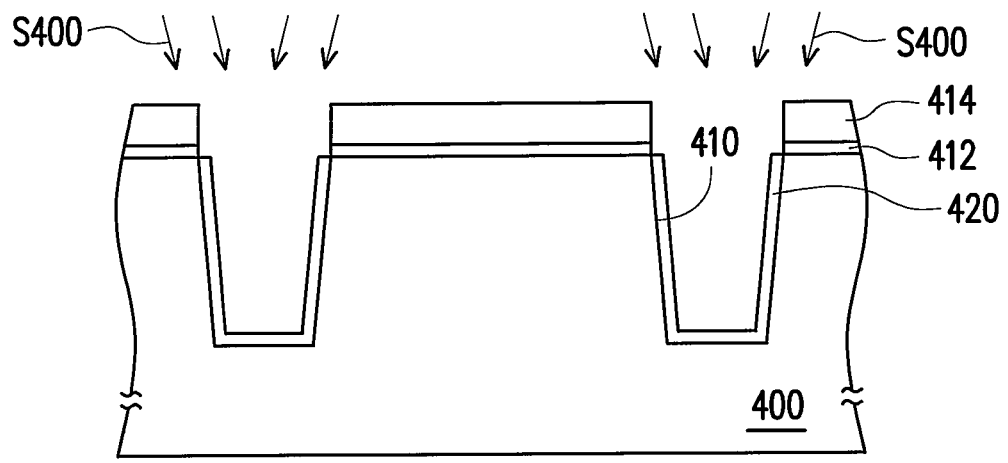
FIGS. 4A-4B are schematic cross-sectional views illustrating a fabrication process of a STI structure according to an embodiment of this invention.
Figure 4B:
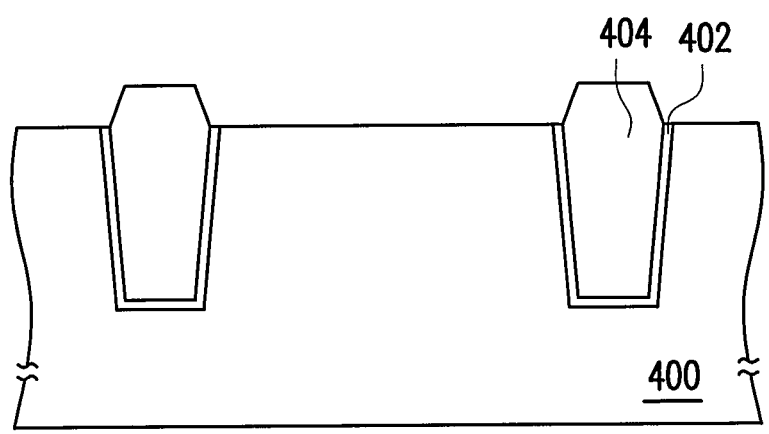

FIGS. 4A-4B are schematic cross-sectional views illustrating the fabrication process of a STI structure according to an embodiment of this invention.

Referring to FIG. 4A, a substrate 400 like a silicon substrate is provided. A patterned pad layer 412 and a patterned mask layer 414 are formed sequentially on the substrate 400. The material of the patterned pad layer 412 is silicon dioxide and the material of the patterned mask layer 414 is silicon nitride, for example. Trenches 410 are then formed in the substrate 400 by removing the partial exposed substrate 400 using the patterned mask layer 414 as the mask. Since the material of the substrate 400 is monocrystalline silicon, oxidation takes place on the exposed surface of the substrate 400 in the trenches 410 to form a native oxide layer 420 when the substrate 400 contacts with oxygen in the atmosphere.

Referring to FIG. 4B, a clearing step S400 that utilizes the method for clearing native oxide of this invention as illustrated in FIG. 2 is conducted to remove the native oxide layer 420, so as to ensure the STI structure a good quality. In an embodiment, the gas introduced in the clearing process includes Ar, $NF_3$ and $NH_3$, and the volumetric flow rate ratio of the gases is within the range of 10:1:1 to 5:1:5. The RF power applied in the clearing process is within the range of 5 W to 200 W. The clearing process is performed at a temperature below 100° C. The pressure suitably set in the clearing process is maintained at about 5 Torr. The duration of the clearing process is usually within the range of 5 seconds to 100 seconds, depending on the thickness of the native oxide layer 420.

A liner 402 is then formed conformally on the surfaces of the trenches 410. The material of the liner 402 is, for example, silicon dioxide, and the formation method thereof is thermal oxidation. An insulating layer (not shown) is formed on the substrate 400 filling up the trenches 410. A portion of the insulating layer is then removed to planarize the surface thereof by means of chemical mechanical polish (CMP) or etching back using the patterned mask layer 414 as the stop layer, so that isolation structures 404 are formed. Subsequently, the patterned mask layer 414 and the patterned pad layer 412 are removed. The material of the insulating layer is, for example, silicon dioxide, and the formation method thereof is chemical vapor deposition (CVD).

Figure 5A:
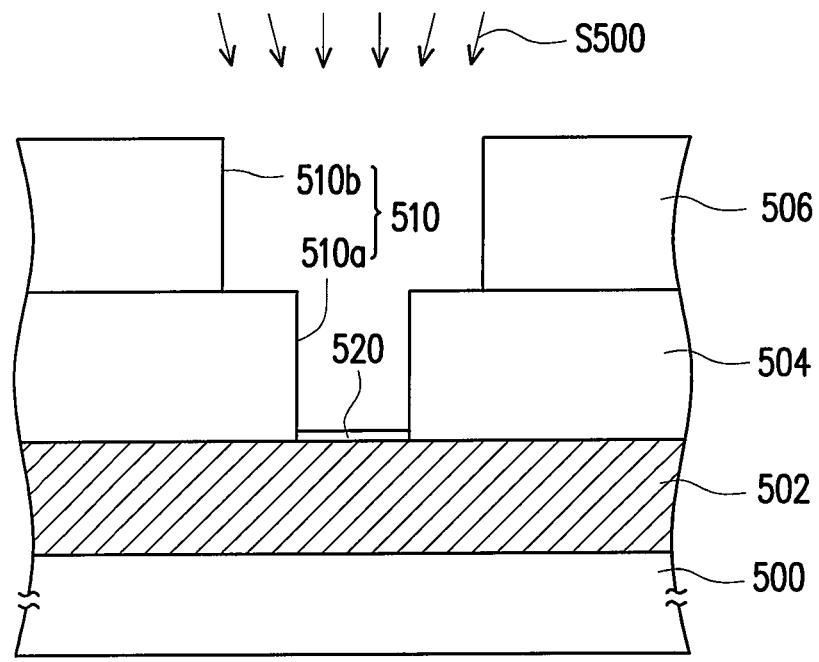
FIGS. 5A-5B are schematic cross-sectional views illustrating a fabrication process of a dual damascene structure according to an embodiment of this invention.
Figure 5B:
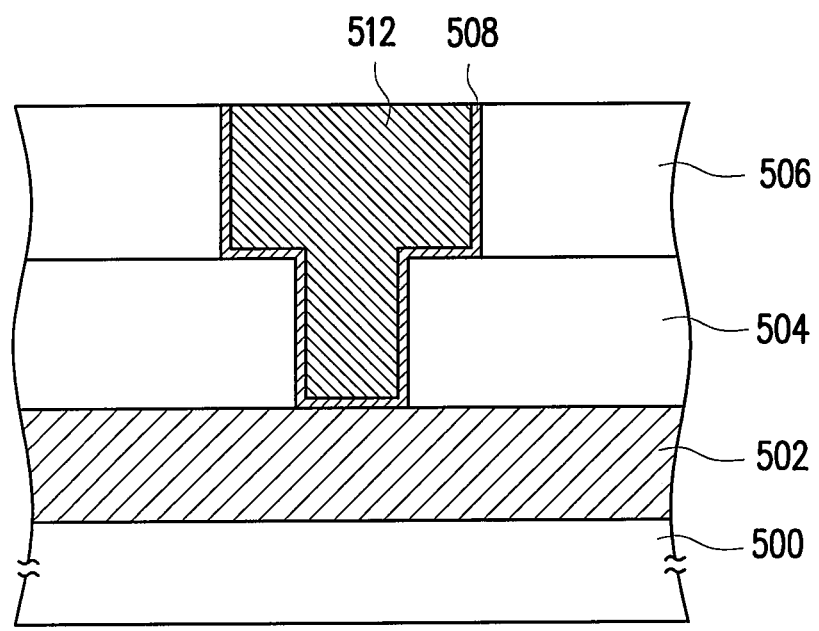

FIGS. 5A-5B are schematic cross-sectional views illustrating the fabrication process of a dual damascene structure according to an embodiment of this invention.

Referring to FIG. 5A, a substrate is provided, whereon a metal layer 502 and dielectric layers 504 and 506 have been formed in sequence. The material of the metal layer 502 is, for example, copper, aluminium or titanium. The material of the dielectric layers 504 and 506 is, for example, silicon dioxide BPSG, PSG or any other suitable dielectric material. An opening 510 is then formed in the dielectric layers 504 and 506 so that a partial surface of the metal layer 502 is exposed. In an embodiment, the opening 510 is a dual damascene opening composed of a trench 510b and a via hole 510a for the formation of the dual damascene structure in the subsequent process. The method for forming the opening 510 is, for example, removing a portion of the dielectric layers 504 and 506 to form the via hole 510a in the dielectric layer 504 and the trench 510a in the dielectric layer 506.

Since the partial surface of the metal layer 502 exposed at the bottom of the opening 510 is oxidized for the contact with air, a native oxide layer 520 is formed on the surface of the metal layer 502 at the bottom of the opening 510.

Referring to FIG. 5B, likewise, a clearing step S500 utilizing the method for clearing native oxide of this invention as illustrated in FIG. 2 is conducted to remove the native oxide layer 520. In an embodiment, the gas introduced in the clearing process includes Ar, $NF_3$ and $NH_3$, and the volumetric flow rate ratio of the gases is within the range of 10:1:1 to 5:1:5. The RF power applied in the clearing process is within the range of 5 W to 200 W. The clearing is performed at a temperature below 100° C. The pressure suitably set in the clearing process is maintained at about 5 Torr. The duration of the clearing process is usually within the range of 5 seconds to 100 seconds, depending on the thickness of the native oxide layer 520.

Afterwards, a barrier layer 508 is formed conformally on the surface of the opening 510. The material of the barrier layer 508 is, for example, a refractory metal or a nitride or an alloy thereof, such as titanium, titanium nitride, tungsten, tungsten nitride, titanium-tungsten alloy, tantalum, tantalum nitride, nickel, nickel-vanadium alloy. A seed layer (not shown) is then formed on the surface of the opening 510 to further enhance adhesion of the subsequently-formed metal layer. A metal layer 512 is filled in the opening 510 to form a dual damascene structure. The material of the metal layer 512 is, for example, copper, aluminium or tungsten. It is noted that after the barrier layer 508 is formed on the surface of the opening 510 but before the seed layer is formed, a native-oxide clearing step S500 including the steps S210 to S220 shown in FIG. 2 can be conducted again, so as to ensure the quality of the barrier layer 508 and reduce the contact resistance of the damascene structure.

Moreover, though this embodiment takes the formation of a dual damascene structure as an example, it does not limit the scope of this invention. The method of this invention can also be applied to a damascene process which forms a metal via plug or a conductive line only, wherein the native-oxide clearing process as described in the above-mentioned embodiment can be utilized to remove the native oxide layer formed on the metal layer after the via hole or the trench is formed, or before or after the barrier layer is formed. Certainly, in other embodiment, a native oxide layer formed on a surface of any opening, hole or trench with a high aspect ratio can be removed by using the method of this invention. Other applications and modifications should be apparent to those of ordinary skill in the art according to the above-mentioned embodiments, and hence, a detailed description thereof is omitted herein.

In view of the above, the method for clearing native oxide of this invention uses a reactant gas including a larger proportion of $NF_3$ and a smaller proportion of $NH_3$ with a higher RF power to form $NH_xHF_y$ for removing the native oxide layer formed in the exposed portion after the opening is formed or before the liner, the adhesion layer or the barrier layer is formed. Since the amount of $NH_xHF_y$ generated from the reactant gas is small and the reaction of $NH_xHF_y$ with the oxide is diffusion-controlled, the reaction rate in removing the native oxide layer can be lowered. Accordingly, after entire $NH_xHF_y$ reacts with the native oxide layer, the reaction with the native oxide layer is saturated, so that over-removal is prevented and the profiles and critical dimensions of openings are prevented from being changed. Thus, the quality of the structure formed subsequently in the opening can be ensured, and the process reliability can also be promoted remarkably.

This invention has been disclosed above in the embodiments, but is not limited to those. It is known to persons skilled in the art that some modifications and innovations may be made without departing from the spirit and scope of this invention. Hence, the scope of this invention should be defined by the following claims.

What is claimed is:

1. A method for clearing native oxide, comprising:
providing a substrate, wherein the substrate has an exposed portion and a native oxide layer has been formed on the exposed portion; and
performing a clearing process to clear the native oxide from the substrate using nitrogen trifluoride ($NF_3$) and ammonia ($NH_3$) as a reactant gas, wherein a volumetric flow rate of $NF_3$ is greater than a volumetric flow rate of $NH_3$.

2. The method according to claim 1, wherein a volumetric flow rate ratio of $NF_3$ to $NH_3$ is within a range of 1.5:1 to 5:1.

3. The method according to claim 2, wherein the volumetric flow rate ratio of $NF_3$ to $NH_3$ is 2:1.

4. The method according to claim 1, wherein the reactant gas forms $NH_xHF_y$ in the clearing process, and x and y both are not zero.

5. The method according to claim 1, wherein an RF power applied in the clearing process is within a range of 5 W to 200 W.

6. The method according to claim 5, wherein the RF power applied in the clearing process is 60 W.

7. The method according to claim 1, wherein a duration of the clearing process is within a range of 5 seconds to 100 seconds.

8. The method according to claim 1, wherein the clearing process is performed at a temperature below 100° C.

9. The method according to claim 1, further comprising performing a first annealing process after the clearing process.

10. The method according to claim 9, wherein a temperature of the first annealing process is within a range of 360° C. to 440° C.

11. The method according to claim 9, wherein a duration of the first annealing process is within a range of 40 seconds to 80 seconds.

12. The method according to claim 9, further comprising performing a second annealing process after the clearing process but before the first annealing process.

13. The method according to claim 12, wherein the second annealing process is an in-situ annealing process.

14. The method according to claim 12, wherein a temperature of the second annealing process is over 100° C.

15. The method according to claim 1, further comprising adding a diluting gas into the reactant gas.

16. The method according to claim 15, wherein the diluting gas comprises an inert gas.

17. The method according to claim 16, wherein a volumetric flow rate ratio of the diluting gas to $NF_3$ to $NH_3$ is within a range of 10:1:1 to 5:1:5.

18. The method according to claim 1, wherein the exposed portion comprises a silicon-containing material or a metal.

19. The method according to claim 18, wherein the silicon-containing material is monocrystalline silicon, polysilicon or metal silicide.

20. The method according to claim 1, wherein the exposed portion is exposed in a contact hole, in a damascene opening, or in a trench of a shallow trench isolation structure to be formed.

* * * * *